United States Patent [19]
Kado

[11] Patent Number: 6,023,633
[45] Date of Patent: Feb. 8, 2000

[54] MAGNETOMEASURING APPARATUS A HAVING A COOLANT VESSEL WITH AN ACCESS OPENING AND SENSOR SUPPORT FOR LIMITING HEAT TRANSFER

[75] Inventor: Hisashi Kado, Kashiwa, Japan

[73] Assignee: Kanazawa Institute of Technology, Ishikawa, Japan

[21] Appl. No.: 09/069,688

[22] Filed: Apr. 29, 1998

Related U.S. Application Data

[62] Division of application No. 08/764,818, Dec. 12, 1996, Pat. No. 5,896,645.

[30] Foreign Application Priority Data

Dec. 14, 1995 [JP] Japan ..................................... 7-325570

[51] Int. Cl.⁷ ....................................................... A61B 5/05
[52] U.S. Cl. ............................ 600/409; 324/244; 324/248
[58] Field of Search ............................ 600/409; 324/244, 324/248

[56] References Cited

U.S. PATENT DOCUMENTS

| | | | |
|---|---|---|---|
| 5,442,289 | 8/1995 | DiIorio et al. | 600/409 |
| 5,657,756 | 8/1997 | Vrba et al. | 600/409 |
| 5,713,354 | 2/1998 | Warden | 600/409 |

*Primary Examiner*—Ruth S. Smith
*Attorney, Agent, or Firm*—Jordan and Hamburg LLP

[57] ABSTRACT

A magnetomeasuring apparatus includes a cooling vessel holding a plurality of magnetic field sensors and a coolant. The magnetomeasuring apparatus comprises a sensor support with the plurality of magnetic field sensors removably mounted thereon, and a fixing device for removably fixing the sensor support with the plural magnetic field sensors mounted thereon to a measuring surface of the cooling vessel. An opening of the cooling vessel is larger than the measuring surface. The magnetomeasuring apparatus has a small opening so that the apparatus has a small total amount of heat intruding the vessel.

4 Claims, 15 Drawing Sheets

PRIOR ART

MAGNETOMEASURING APPARATUS A HAVING A COOLANT VESSEL WITH AN ACCESS OPENING AND SENSOR SUPPORT FOR LIMITING HEAT TRANSFER

This is a division of application Ser. No. 08/764,818, filed Dec. 12, 1996 now U.S. Pat. No. 5,896,645.

BACKGROUND OF THE INVENTION

The present invention relates to a magnetomeasuring apparatus using superconducting quantum interference devices (SQUIDs) as magnetic field sensors, a method for assembling the same, a method for maintaining the same, and a diagnostic apparatus using the same.

Magnetomeasuring apparatuses using SQUIDs as magnetic field sensors are known. The SQUIDs have high sensitivities permitting the magnetomeasuring apparatus using the SQUIDs to measure weak biomagnetic fields.

One of such known magnetomeasuring apparatuses is a weak magnetic field measuring apparatus for measuring magnetic fields generated in, e.g., a head of a human, and is disclosed in Japanese Patent Laid-Open Publication No. Tokkai Hei 04-315075/1992. As shown in FIG. 16, a weak magnetic field measuring device 1 comprises a dewar vessel 2 including an inner vessel 2a and an outer vessel 2b. A bottom of the dewar vessel 2 is shaped in conformity with a head of a human being. A support shell 3 is accommodated in the bottom of the dewar vessel 2. The support shell 3 is formed in a shape contoured to the bottom of the dewar vessel 2. A plurality of SQUIDs 4 are arranged in the support shell 3, enclosing the bottom. The support shell 3 constitutes one unit 6 together with a mother board 5 in the form of a printed circuit board, etc. The unit 6 is submerged in liquid helium, a coolant. A neck plug 9 is disposed above the unit 6 on a support 8 and is housed in an upper part of the interior of the dewar vessel 2. The neck plug 9 comprises a radiation shielding and cabling unit. The support 8 has electric components mounted thereon.

The respective component members in the dewar vessel 2 are provided in units, and the unit 6 of the support shell 3 with the neck plug 9 and the support 8 can be removed from the dewar vessel 2 independently.

In order that a magnetomeasuring apparatus measures, with precision, a magnetic field over a wide range, it is necessary to arrange a number of magnetic field sensors over a wide range. Accordingly, the SQUIDs 4 of the weak magnetic field measuring apparatus 1 are mounted on the support shell 3 formed in a helmet-shape which can cover a head over a wide area. The support shell 3 must have an at least 30 cm-opening diameter, and the opening of the dewar vessel 2, through which the unit 6 including the support shell 3 is passed, has a diameter as large as above 30 cm.

Liquid helium, a coolant, is very volatile, and it is necessary to minimize intrusion of heat from the outside. Major routes of the heat intrusion into the dewar vessel 2 are the vacuum heat-insulating layer between the inner vessel 2a and the outer vessel 2b, and the opening of the dewar vessel 2. Loss of the liquid helium due to heat conduction in the opening and the wall of the dewar vessel 2a occupies a considerably high ratio, and the intruding heat reaches a considerably large total amount.

Thus, a large diameter of the opening of the dewar vessel 2 increases loss of the liquid helium in the dewar vessel 2 due to the intruded heat. Expensive liquid helium must be frequently supplied, which results in a disadvantage of higher maintenance costs.

An increase of a length of the opening of the dewar vessel 2 reduces heat conduction, but the dewar vessel 2 becomes taller. The taller dewar vessel 2 requires large rooms for installing the weak magnetic field measuring device 1.

SUMMARY OF THE INVENTION

An object of the present invention is to provide a magnetomeasuring apparatus the vessel having a small opening so that the apparatus has a small total amount of heat intruding into the vessel, a method for assembling the same and a method for maintaining the same.

Another object of the present invention is to provide a diagnostic apparatus using the magnetomeasuring apparatus having a small opening so that the apparatus has a small total amount of heat intruding into the vessel.

The above-described objects are achieved by a magnetomeasuring apparatus including magnetic field sensors and a coolant held in a cooling vessel, comprising: a sensor support for disengageably supporting the magnetic field sensors; and fixing means for fixing the sensor support with the magnetic field sensors mounted thereon to a measuring surface of the cooling vessel wherein an opening of the cooling vessel has a smaller size than the measuring surface for the sensor support to be fixed to.

In the above-described magnetomeasuring apparatus, it is preferable that the measuring surface of the cooling vessel is formed in a concave shape for covering at least a part of a head of a human being at one side of the cooling vessel, and that the sensor support has a configuration which permits the magnetic field sensors to be arranged in conformity with the configuration of the measuring surface.

The above-described objects are achieved by a magnetomeasuring apparatus assembly method for assembling the magnetomeasuring apparatus, comprising the steps of disengaging a sensor support from a measuring surface of a coolant vessel, holding the sensor support near the opening of the cooling vessel, mounting magnetic field sensors on the sensor support, and fixing the sensor support with the magnetic field sensors mounted on to the measuring surface of the cooling vessel.

The above-described objects are achieved by a magnetomeasuring apparatus maintenance method for maintaining the magnetomeasuring apparatus, comprising the steps of disengaging the sensor support with the magnetic field sensors from the measuring surface of the cooling vessel, holding the sensor support near the opening of the cooling vessel, removing a defective one of the magnetic field sensors from the sensor support, mounting a normal magnetic field sensor in place of the defective one, and fixing the sensor support with the normal magnetic field sensor to the measuring surface of the cooling vessel.

The above-described objects are achieved by a diagnostic apparatus for magnetomeasurement comprising: a bed for a patient to be diagnosed to lie on; the above-described magnetomeasuring apparatus disposed on an end of the bed and arranged so that the head of the patient is to be positioned near the measuring surface.

DETAILED DESCRIPTION OF THE INVENTION

Figure 1:
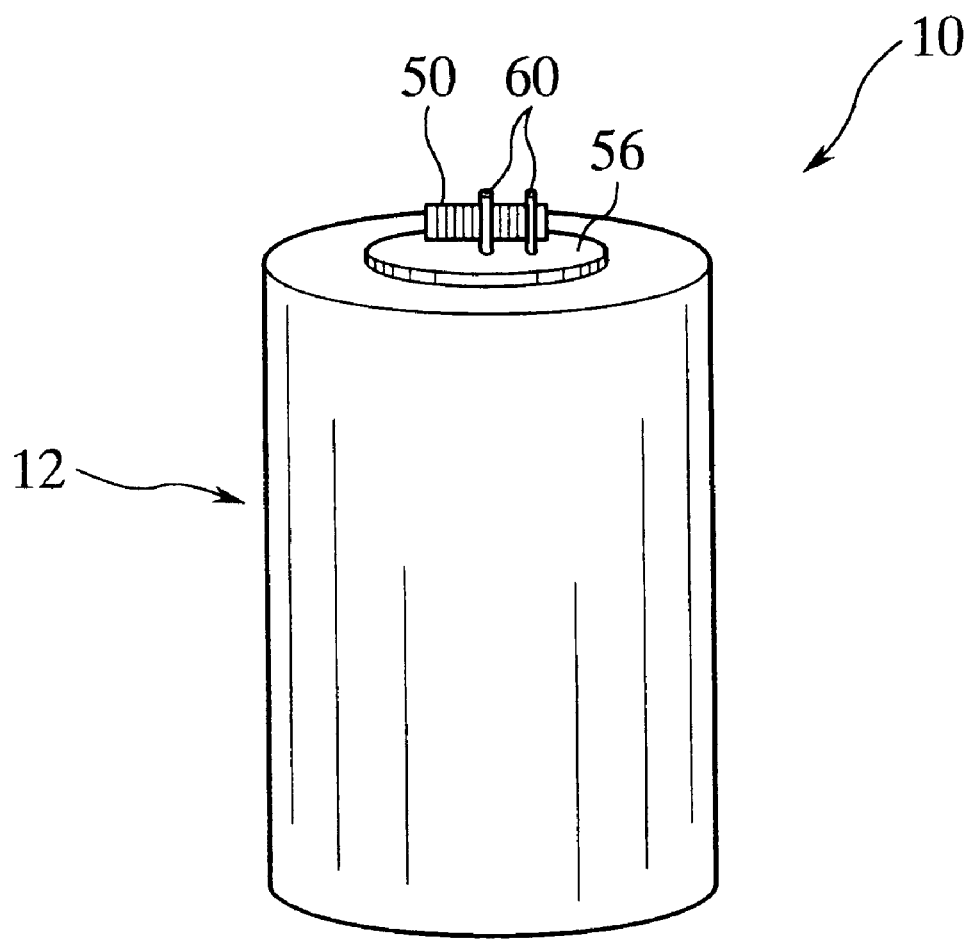
FIG. 1 is a perspective view of a magnetomeasuring apparatus according to a first embodiment of the present invention.
Figure 2:
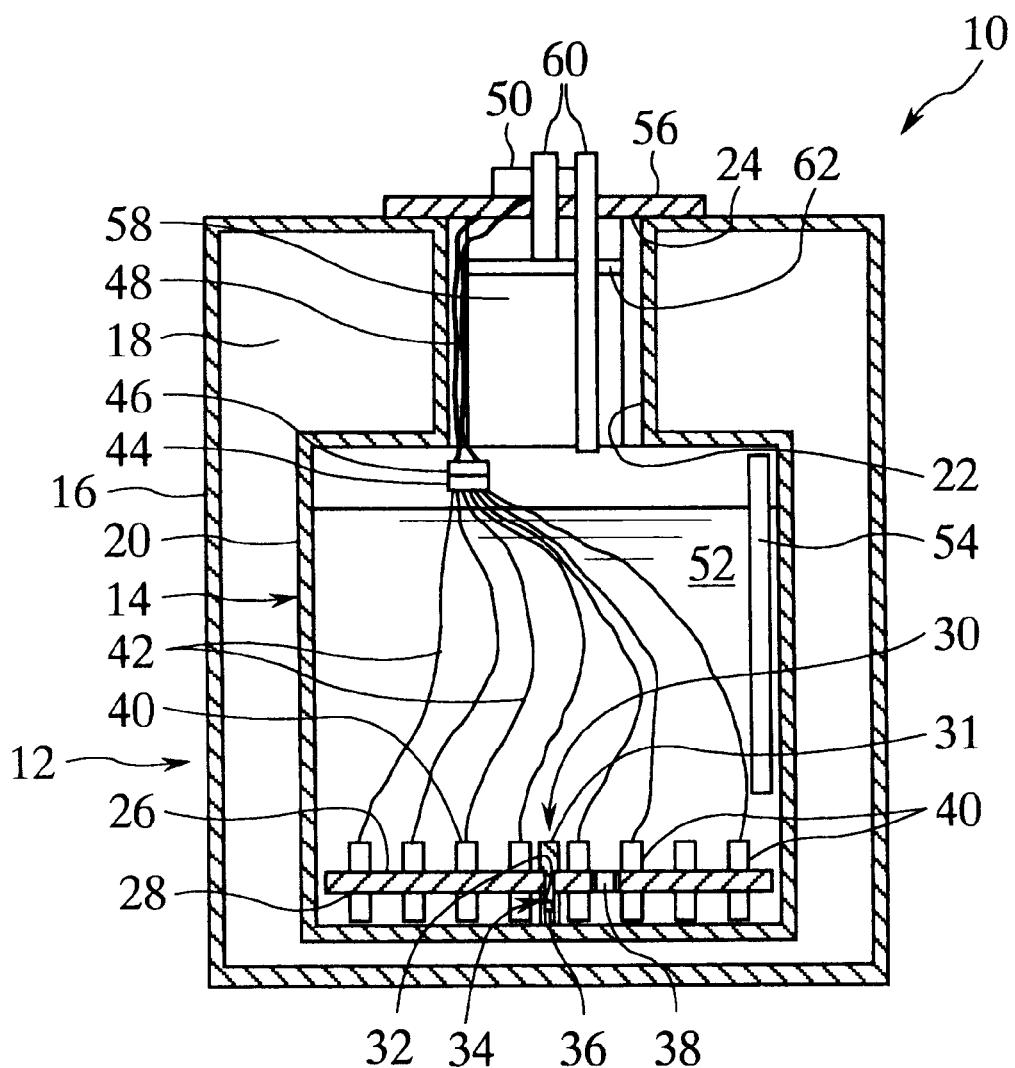
FIG. 2 is a vertical sectional view of the magnetomeasuring apparatus according to the first embodiment of the present invention.
Figure 3:
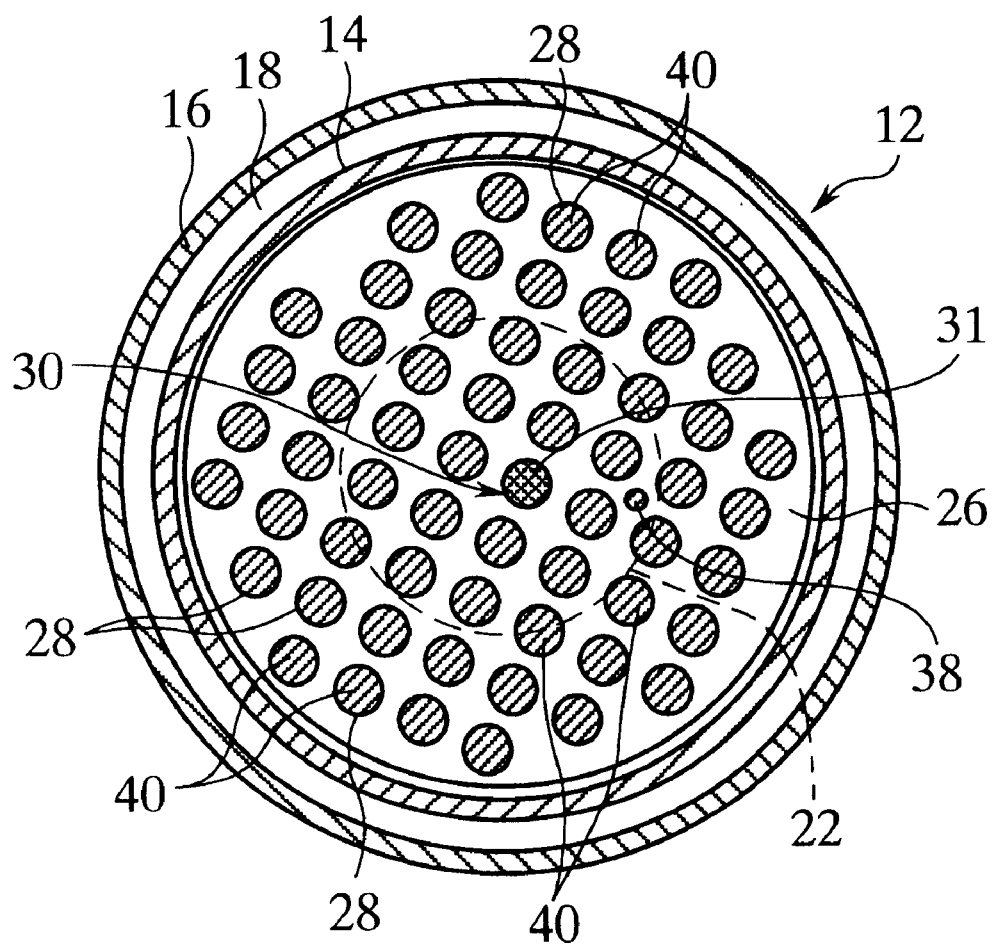
FIG. 3 is a cross-sectional view of the magnetomeasuring apparatus according to the first embodiment of the present invention, which shows an arrangement of magnetic field sensors.
Figure 4A:
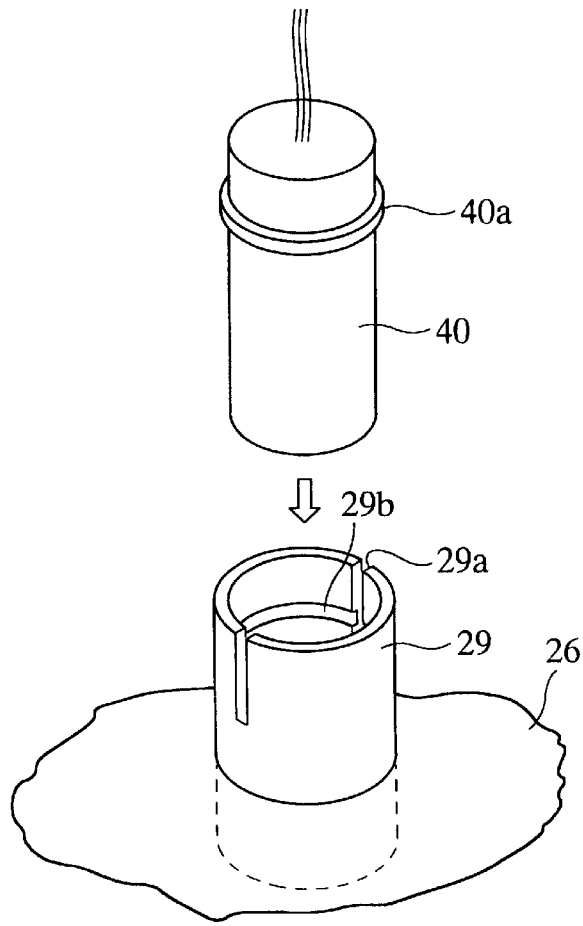
FIGS. 4A and 4B are views showing an example of a structure for mounting magnetic field sensors on the sensor support in the magnetomeasuring apparatus according to the first embodiment of the present invention.
Figure 4B:
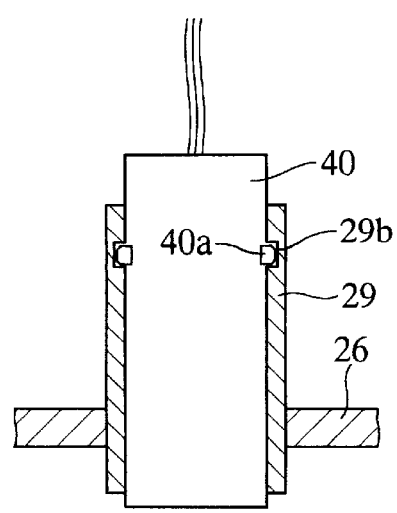
Figure 5:
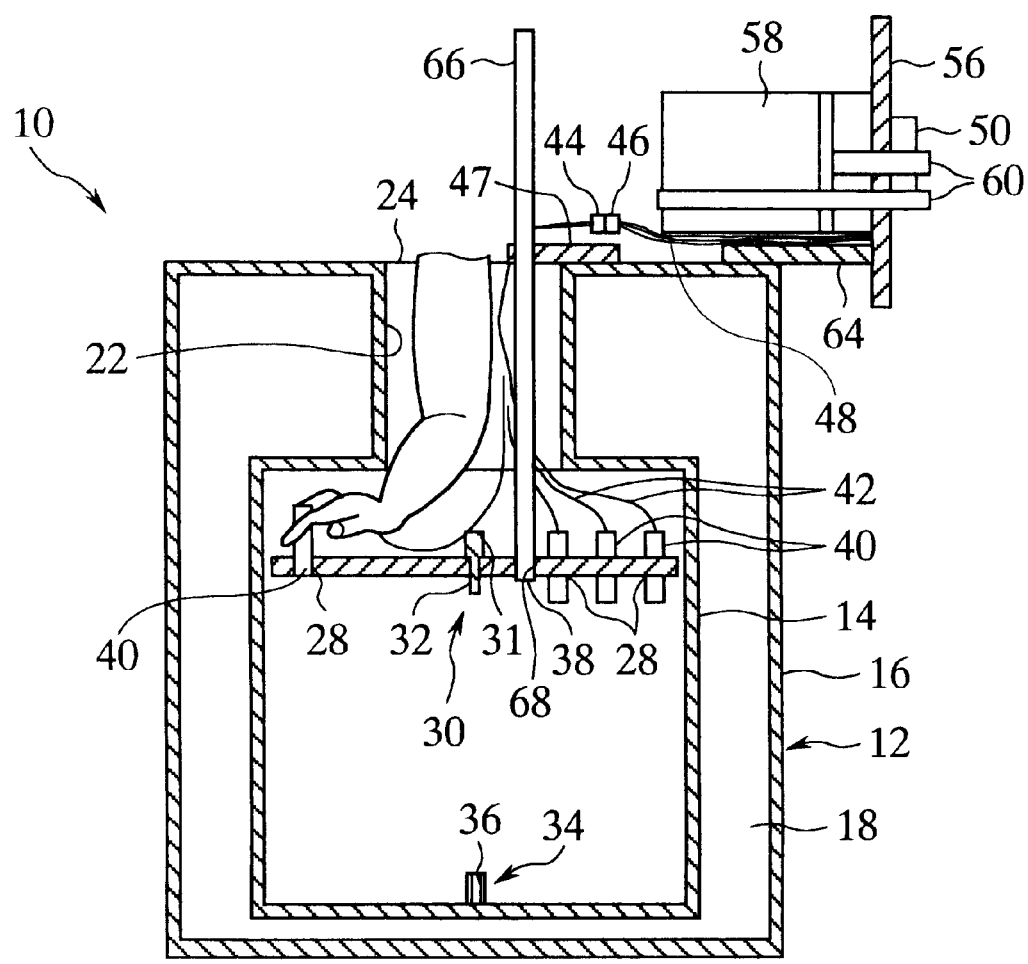
FIG. 5 is a view explaining mounting of magnetic field sensors on the sensor support in the magnetomeasuring apparatus according to the first embodiment of the present invention.

A magnetomeasuring apparatus according to a first embodiment of the present invention is now explained with reference of FIGS. 1 to 9. FIG. 1 is a perspective view of the magnetomeasuring apparatus according to the first embodiment. FIG. 2 is a vertical sectional view of the magnetomeasuring apparatus according to the first embodiment. FIG. 3 is a cross-sectional view of the magnetomeasuring apparatus according to the first embodiment showing the arrangement of magnetic field sensors of the magnetomeasuring apparatus according to the first embodiment. FIGS. 4A and 4B are views showing an example of a structure for mounting magnetic field sensors on the sensor support in the magnetomeasuring apparatus according to the first embodiment of the present invention. FIG. 5 is a view showing a mounted state of the magnetic field sensors on the sensor support of the magnetomeasuring apparatus.

As shown in FIG. 1, the magnetomeasuring apparatus 10 includes a cryostat 12 which is a bottomed cylindrical vessel. As shown in FIG. 2, the cryostat 12 has a double structure of an inner bottomed cylindrical vessel 14 accommodated in an outer bottomed cylindrical vessel 16. A heat insulating material 18 is filled between the inner vessel 14 and the outer vessel 16.

The inner vessel 14 includes an inner vessel body 20, and a cylindrical opened space 22 projected from a top of the inner vessel body 20. The opened space 22 has an outlet and an inner diameter smaller than that of the inner vessel body 20. The opened space 22 has about a 14 cm-inner diameter and about a 30 cm-height. The outer vessel 16 has a top opening 24 which is in communication with the opened space 22.

A sensor support 26 is accommodated in the inner vessel body 20. The sensor support 26 is disc shaped and is a little smaller than the inner diameter than the inner vessel body 20. Its diameter is 30–40 cm. A plurality of holes 28 are formed at a substantially constant pitch in the entire surface of the sensor support 26.

As shown in FIG. 3, a male clamp 30 is provided at substantially a center of the surface of the sensor support 26. As shown in FIGS. 2 and 5, the male clamp 30 includes a knob 31 projected through a front surface of the sensor support 26 and an insert 32 projected through a back surface of the sensor support 26.

A female clamp 34, corresponding to the male clamp 30, is provided on the bottom of the vessel body 20. The female clamp 34 includes a receiver 36 for holding the insert 32 engaged therein. The insert 32 of the male clamp 30 is pushed in the receiver 36 of the female clamp 34, whereby, as shown in FIG. 2, the insert 32 is engaged with the receiver 36 and the male clamp 30 is connected to the female clamp 34. The insert 32 of the male clamp 30 is pulled out of the receiver 36 of the female clamp 34, whereby, as shown in FIG. 5, the insert 32 is disengaged from the receiver 36, and the male clamp 30 is separated from the female clamp 34. The clamps 30 and 34 may be replaced by screws.

As shown in FIGS. 2 and 3, a tapped hole 38 is formed in a substantially center portion of the surface of the sensor support 26. The tapped hole 38 may be within the male clamp 30. A lift rod 66, which will be described below, can be screwed into the tapped hole 38.

As shown in FIG. 3, magnetic field sensors 40, comprising SQUIDs, are engaged fixedly in respective ones of the holes 28 in the sensor support 26. The magnetic field sensors 40 are fixed in the sensor support 26 regularly at a constant pitch over substantially the entire surface of the sensor support 26. The magnetic field sensors 40 are preferably in the form of SQUIDs which can measure weak biomagnetic fields, including those generated in a head of a human being.

With reference to FIG. 4, an example of the structure for mounting the magnetic field sensor 40 on the sensor support 26 will be explained.

As shown in FIG. 4A, sensor supports 29 for supporting the magnetic field sensors 40 are provided in respective ones of the holes 26 in the sensor support 26. Each of the sensor supports 29 is in the shape of a thin cylinder. Slits 29a are formed in 2 to 4 upper parts of the cylinder, and a groove 29b is formed in an inside surface thereof. A ring 40a is formed on a circumference of each of the magnetic field sensors 40.

As shown in FIG. 4B, when the magnetic field sensor 40 is inserted into the sensor support 29, the slits 29a allow the upper part of the sensor support 29 to expand slightly outward to facilitate engagement of the magnetic field sensor 40. When the magnetic field sensor 40 is further engaged into the sensor support 29, the ring 40a is engaged into the groove 29b in the sensor support 29 and thereby positioned.

To measure a magnetic filed distribution over a wide range when measuring magnetic fields, it is necessary to arrange a number of the magnetic field sensors 40 over a wide range. To this end, the sensor support 26 is formed sufficiently wide to accommodate a number of the magnetic field sensors 40 necessary for objects to be measured.

As shown in FIG. 2, measuring cords 42 are led out from the respective magnetic field sensors 40. The respective measuring cords 42 led out from the respective magnetic field sensors 40 are collected by a cord connector 44. The cord connector 44 is connected to a wiring connector 46. All the necessary number of wiring cords 48 are collected at the wiring connector 46. The wiring cords 48 are connected to a cord output 50 disposed on an outside surface of a cap 56, which will be described later, through a gap between a heat insulator 58 and the opened space 22. The wiring cord 48 is formed of a high electric resistance wire having low heat conductivity, whereby heat intrusion due to the heat conduction is suppressed to low levels.

The inner vessel body 20 holds liquid helium 52 in which the magnetic field sensors 40 are submerged (see FIG. 2). The liquid helium 52 is a coolant for the magnetic field sensors 40. A level sensor 54 is disposed inside the inner vessel body 20 vertically along an inside wall thereof. The level sensor 54 detects a level of the liquid helium 52 held in the inner vessel body 20.

As shown in FIGS. 1 and 2, the top opening 24 of the outer vessel 16 is closed by a cap 56 having a larger diameter than the top opening 24. The cap 56 prevents vaporization due to contact between air and the liquid helium 52. On an underside of the cap 56 there is provided the cylindrical heat insulation portion 58 having a little smaller configuration than an inner diameter of the opened space 22 and substantially the same height as the opened space 22. When the cap 56 closes the top opening 24, the heat insulation portion 58 is inserted into the opened space 22.

In the cap 56 there are provided two charge/discharge pipes 60 which are opened on the outer side of the cap 56. As shown in FIG. 2, one of the charge/discharge pipes 60 has an end communicated with a communication hole 62 of the heat insulation portion 58, and the other of the charge/discharge pipes 60 has an end opened at the underside of the heat insulation portion 58. The communication hole 62 crosses the heat insulation portion 58 and opens at an outer circumference at opposed positions. Liquid helium is fed into the inner vessel body 20 through the charge/discharge pipe 60 or helium gas is discharged from the inner vessel body 20.

The inner vessel 14, the outer vessel 16, and almost all constituent members of the cryostat 12 are formed of non-magnetic and non-conducting material, such as fiber-reinforced resin or others. The heat insulation portion 58 is formed of heat insulating material comprising multi-layers of polyester resin foils with aluminium vapor deposited thereon.

The bottoms of the inner vessel 14 and the outer vessel 16 are not essentially flat and may have arbitrary shapes as required. For example, the bottoms may be helmet-shaped.

The mounting of the magnetic field sensors 40 on the sensor support 26 is carried out when the magnetomeasuring apparatus 10 is first assembled and when defective ones of the magnetic field sensors 40 are replaced by new ones during maintenance.

In order to mount the magnetic field sensors 40 on the sensor support 26 having a larger diameter than an inner diameter than the opening 22 of the inner vessel 14, as shown in FIG. 5, an operator puts a hand into inner vessel 14 through the opening 22 while the sensor support 26 is pulled up to a lower end of the opening 22.

Figure 6A:
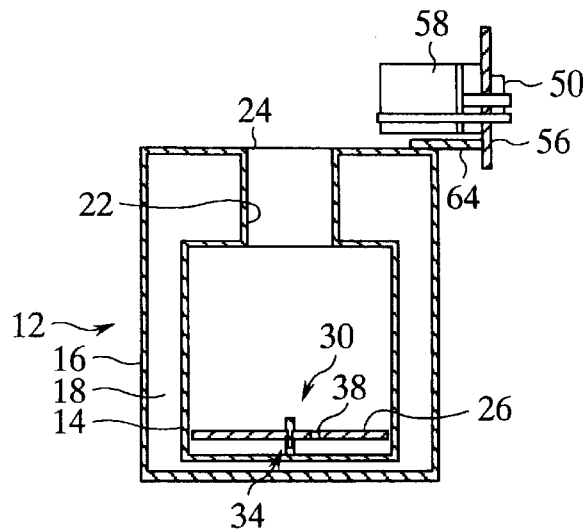
FIGS. 6A to 6C are views explaining a method for assembling the magnetomeasuring apparatus according to the first embodiment of the present invention.

The method for assembling the magnetomeasuring apparatus 10 by mounting the magnetic field sensors 40 on the sensor support 26 is explained with reference to FIG. 6.

First, the opening 24 of the outer vessel 16 of the cryostat 12 is opened. The cap 56 closing the upper opening 24 is lifted to pull out the heat insulation portion 58. The cap 56 is disengaged from the top opening 24 and is rested horizontal on the cap support 64. In the inner vessel 14 of the cryostat 12, the sensor support 26 is secured to the bottom surface of the inner vessel 14 by the engagement between the male clamp 30 and the female clamp 34. The sensor support 26 is installed in the inner vessel 14 when the inner vessel 14 is fabricated and assembled.

Then, the male clamp 30 is disengaged from the female clamp 34 by using the lift rod 66. The lift rod 66 has a length greater than a distance from the top opening 24 to the inside bottom of the inner vessel 14, and has a threaded portion 68 for engaging a tapped hole 38 of the sensor support 26. The lift rod 66 is registered with the tapped hole 38 of the sensor support 26 and turned to be threaded into the tapped hole 38 of the sensor support 26. The lift rod 66 and the sensor support 26 are then lifted. By lifting the lift rod 66, the male clamp 30 is pulled and disengaged from the female clamp 34. After the male clamp 30 is disengaged from the female clamp 34, the sensor support 26 is lifted up to the vicinity of the open space 22.

Figure 6B:
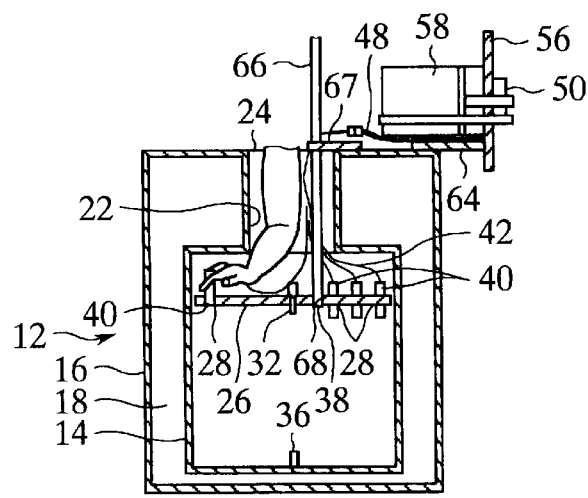

Then, the lifted sensor support 26 is held in the lifted state as shown in FIG. 6B. The lift rod 66, engaged with the lifted sensor support 26, is secured to a rod support 67 provided on the top surface of the outer vessel 16 proximate the top opening 24.

Then, as shown in FIG. 6B, a magnetic field sensor 40 is inserted by hand into the opened space 22, through the top opening 24, to be mounted on the sensor support 26. The open space 22 has about a 14 cm-diameter which allows the hand and arm holding the magnetic field sensor 40 to be put into the open space 22. The operation is monitored through the open space 22 by a fiberscope, a CCD camera, a mirror or other observation means.

The measuring cords 42 of the respective magnetic field sensors 40 are wired to the cord output 50 through the cord connector 44 connected to the wiring connector 46. The magnetic field sensors 40 are pushed into the holes 28 to be secured to the sensor support 26.

Figure 6C:
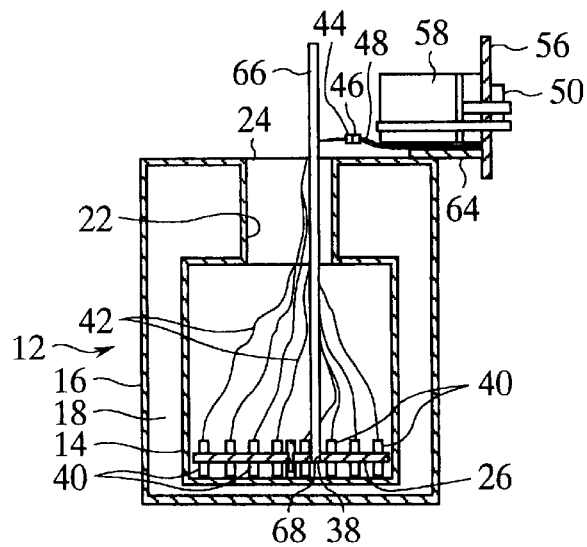

Then, as shown in FIG. 6C, the sensor support 26 with the magnetic field sensors 40 mounted thereon is secured to the bottom surface of the inner vessel 14. When the mounting of the magnetic field sensors 40 on the sensor support 26 is completed, the lift rod 66 is held hand and removed from the rod support 67 and lowered in the inner vessel 14. When the sensor support 26 approaches the bottom surface of the inner vessel 14, the male clamp 30 of the sensor support 26 is registered with the female clamp 34, and the lift rod 66 is pushed downward to engage the male clamp 30 with the female clamp 34.

Then, the lift rod 66 is removed from the sensor support 26. The lift rod 66, which is screwed into the sensor support 26, is turned in an opposite direction then before to be disengaged from the sensor support 26. The lift rod 66 is removed from the sensor support 26 and is taken out of the inner vessel 14.

Thus, the magnetic field sensors 40 are mounted on the sensor support 26 without taking the sensor support 26 out of the inner vessel 14 to assemble the magnetomeasuring apparatus 10.

Figure 7A:
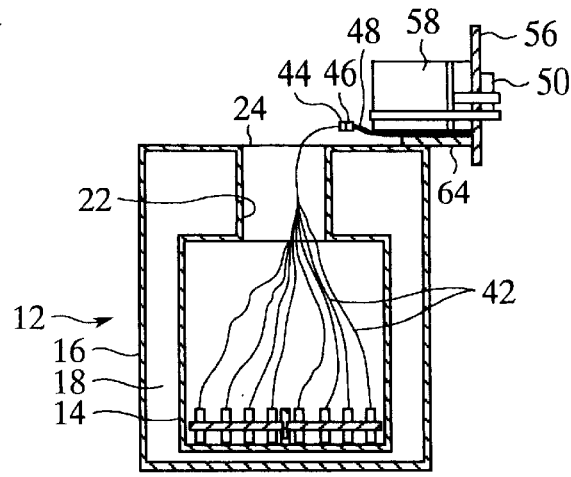
FIGS. 7A to 7C are views explaining a method for maintaining the magnetomeasuring apparatus according to the first embodiment of the present invention.

Next, the method for maintaining the magnetomeasuring apparatus by replacing magnetic field sensors 40 mounted on the sensor support 26 is explained with reference to FIG. 7. Steps of the maintenance method similar to those of the assembling method will not be explained to simplify the explanation of the maintenance method.

First, the top opening 24 of the outer vessel 16 of the cryostat 12 is opened. The cap 56 is removed from the top opening 24 and is rested on the cap support 64. In the inner vessel 14 of the cryostat 12, the sensor support 26 with the magnetic field sensors 40 mounted thereon is secured to the bottom surface of the inner vessel 14. The measuring cords 42 of the respective sensors 40 are wired to the cord output 50 through the cord connector 44 connected to the wiring connector 46. The liquid helium 52 in the inner vessel 14 is discharged in advance from the inner vessel 14.

Then, the male clamp 30 is disengaged from the female clamp 34. The lift rod 66 is lifted to disengage the male clamp 30 from the female clamp 34 and lift the sensor support 26 up to near the lower end of the opened space 22. Then, the lifted sensor support 26 is held in the state shown in FIG. 7B.

Figure 7B:
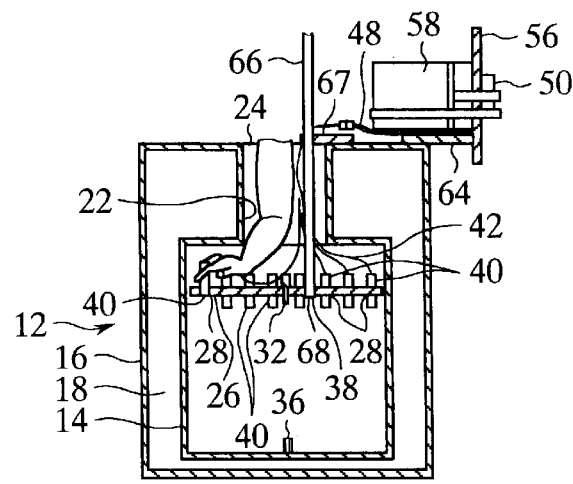

Next, as shown in FIG. 7B, a hand is put into the opened space 22 through the top opening 24 to pull a magnetic field sensor 40, which is to be replaced, from the sensor support 26.

The measuring cord of a new magnetic field sensor 40, replacing the pulled-out magnetic field sensor 40, is wired to the cord output 50 through the cord connector 44 connected to the wiring connector 46.

Then, as shown in FIG. 7B, the new magnetic field sensor 40, whose measuring cord has been wired to the cord output 50, is held by hand and put into the open space 22 through the top opening 24, and is then mounted on the sensor support 26.

Figure 7C:
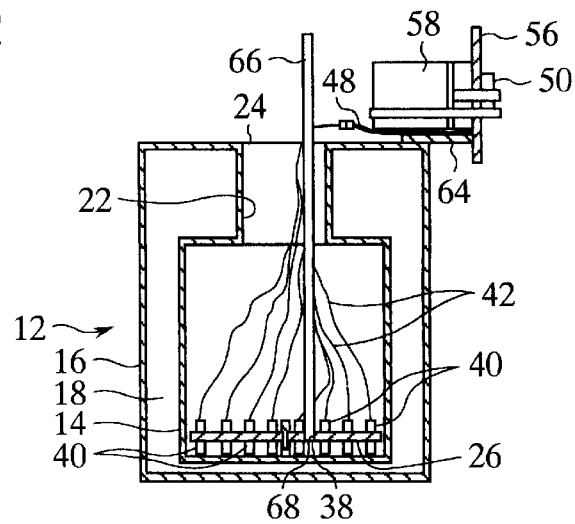

Then, as shown in FIG. 7C, the sensor support 26, with the new magnetic field sensor 40 mounted thereon, is secured to the bottom surface of the inner vessel 14.

Then, the lift rod 66 is removed from the sensor support 26.

Thus, even if one of the magnetic field sensors 26 malfunctions, the defective magnetic field sensor can be replaced by a normal magnetic field sensor without taking the sensor support 26 out of the inner vessel 14.

As described above, according to the present embodiment, it suffices that the open space 22 has a size sufficient for a human hand to pass through, e.g., has about a 14 cm diameter, a 2–3 mm thickness and about a 30 cm length. The conventional magnetomeasuring apparatus has a 30–40 cm diameter, a 4–5 mm thickness and a 40–50 cm length. In comparison with the conventional apparatus, the magnetomeasuring apparatus according to the present invention is reduced to a diameter which is ½–⅓ of the conventional apparatus, and a length which is about ⅘ of the conventional apparatus.

The heat conducted through the open space 22 is proportional to a diameter of the open space 22, and heat conducted through the heat insulation material inserted in the open space 22 is proportional to a sectional area, or square of a diameter of the open space 22, and linearly proportional to a length of the open space 22. Even in consideration of a heat conduction increase due to the smaller length, heat intrusion occurring because of the open space 22 is drastically decreased in comparison with that in conventional magnetomeasuring apparatuses. In the present embodiment, the clamps 30, 34 are used to secure the sensor support 26 to the bottom surface of the inner vessel body 20, but different means may be used as alternatives.

Figure 8:
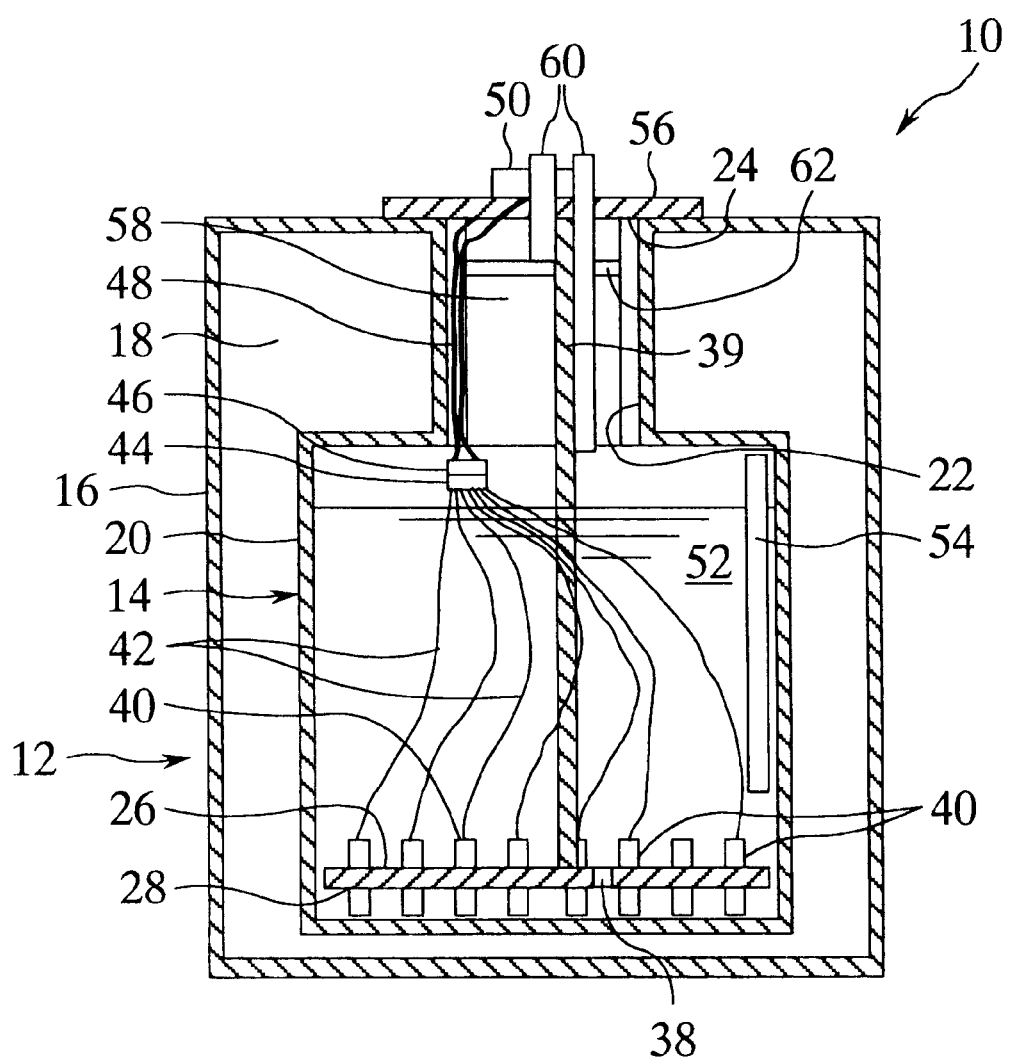
FIG. 8 is a vertical sectional view of the magnetomeasuring apparatus according to the first embodiment of the present invention showing another example of securing the sensor support to the bottom of the inner vessel body.

As shown in FIG. 8, for example, the sensor support 26 may be fixed by a support rod 39 which is in turn fixed to the cap 56, and passes through the heat insulation portion 22 to the sensor support 26. The support rod 39 is formed of FRP. The sensor support 26 is pressed against the bottom surface of the inner vessel body 20 by flexibility exhibited when the support rod 39 is flexed. A single support rod 39 or a plurality of support rods 38 may be used.

Figure 9:
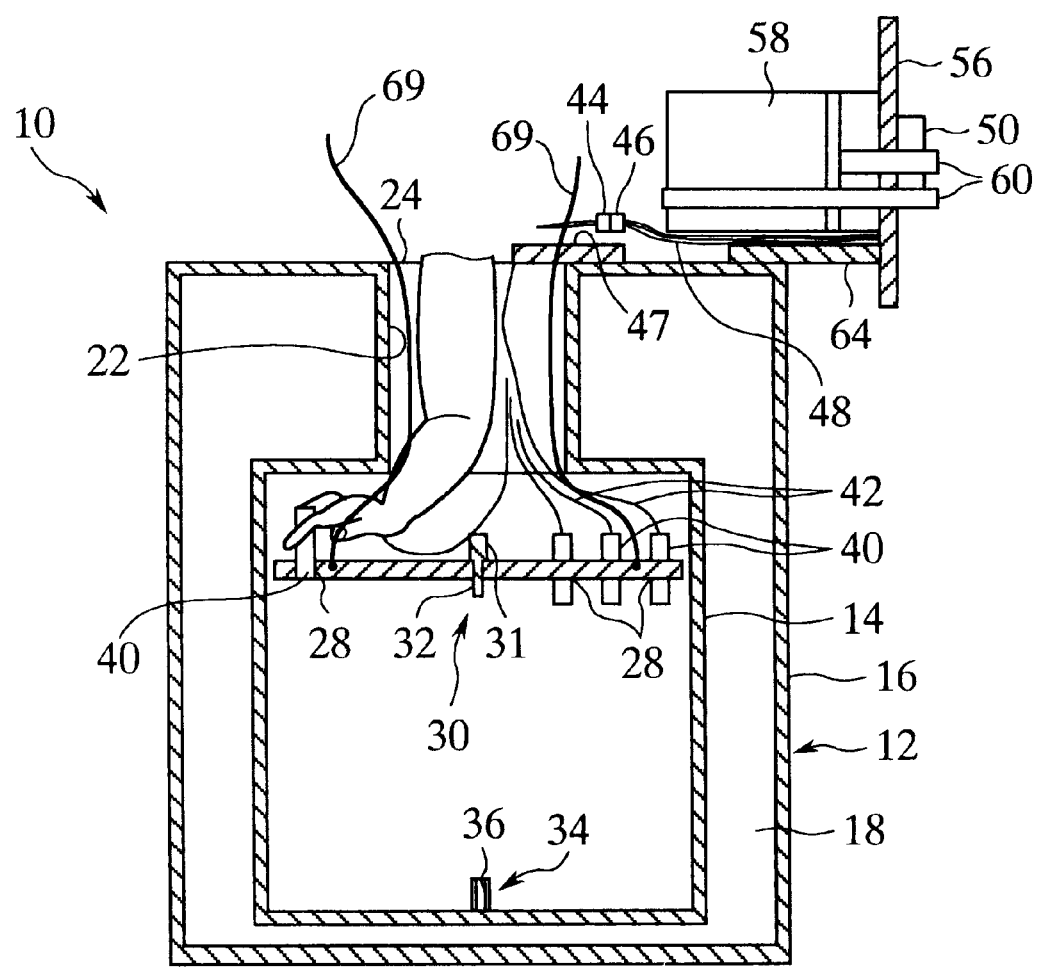
FIG. 9 is a vertical sectional view of the magnetomeasuring apparatus according to the first embodiment of the present invention showing another example of lifting the sensor support.

In the present embodiment, the sensor support 26 is lifted by the lift rod 66 but may be lifted by different means. As shown in FIG. 9, however, a plurality of strings 69 of glass fiber or plastics are fixed to the sensor support 26, and when the sensor support 26 is lifted, the strings 69 are pulled up to lift the sensor support 26. The lift rod 66 and the strings 69 may be used together.

Figure 10:
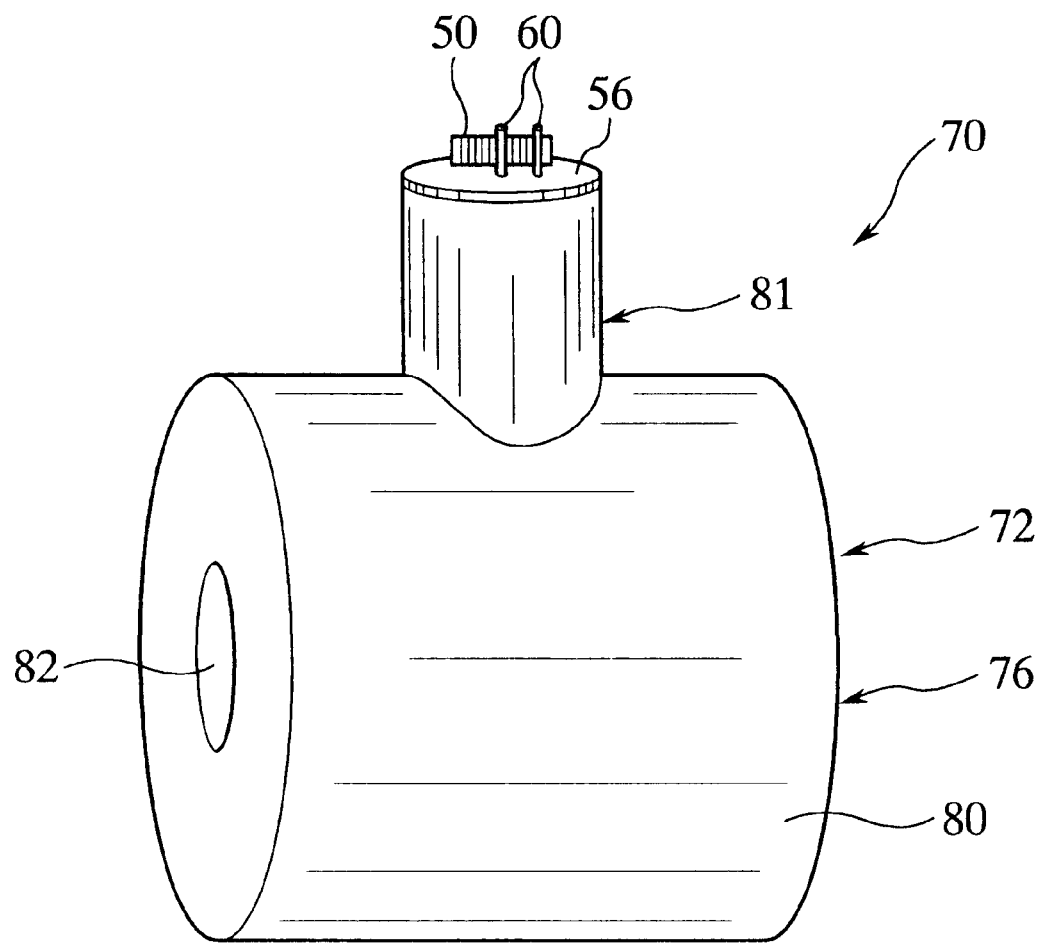
FIG. 10 is a perspective view of a magnetomeasuring apparatus according to a second embodiment of the present invention.

Next, the magnetomeasuring apparatus according to a second embodiment of the present invention is explained with reference to FIGS. 10 and 11. FIG. 10 is a perspective view of the magnetomeasuring apparatus, and FIG. 11 is a vertical sectional view of the magnetomeasuring apparatus.

Figure 11:
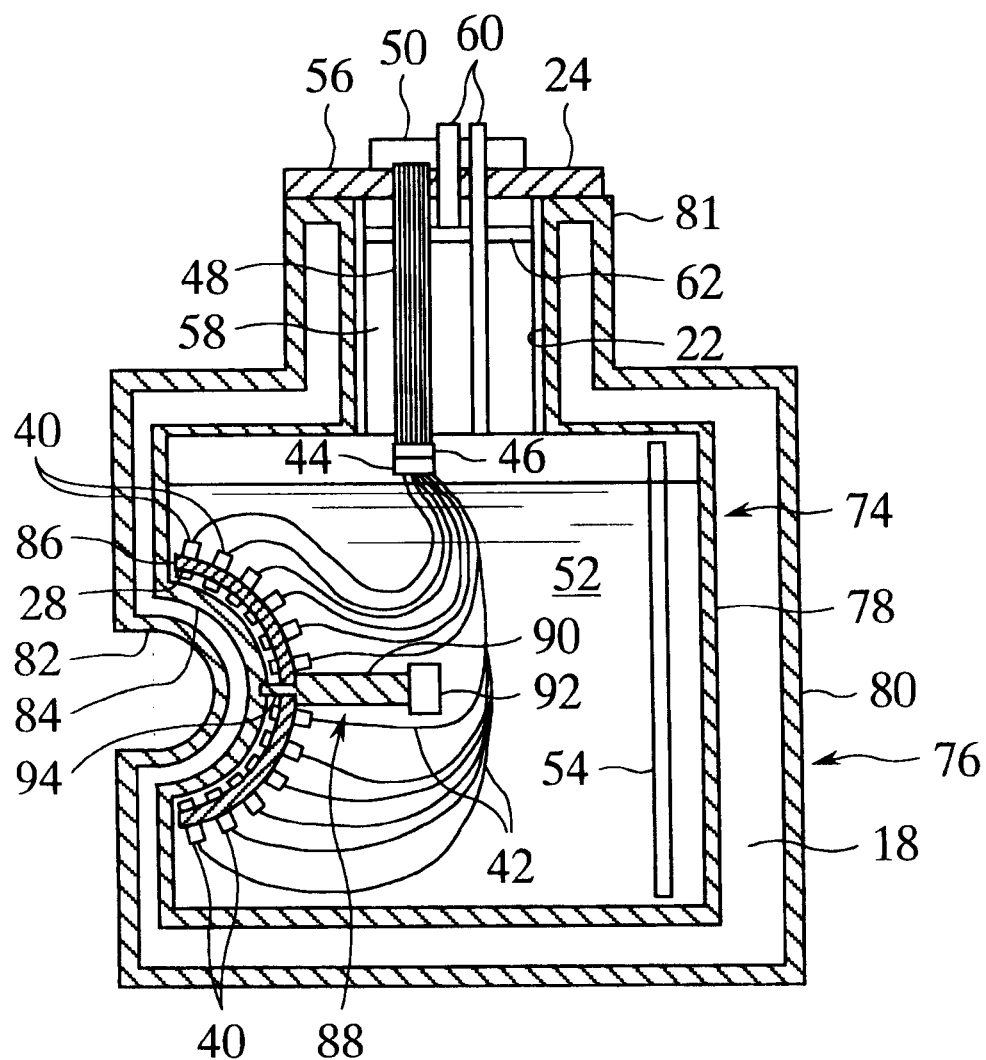
FIG. 11 is a vertical sectional view of the magnetomeasuring apparatus according to the second embodiment of the present invention.

As shown in FIGS. 10 and 11, the magnetomeasuring apparatus 70 has the same structure as the magnetomeasuring apparatus according to the first embodiment except that the former includes a concavity in one side and a configuration which contains the open space 22 upwardly projected.

As shown in FIG. 11, the cryostat 72 has a double structure of an inner vessel 74 accommodated in an outer vessel 76 similar to the inner vessel, and a heat insulation material 18 is filled between the inner and the outer vessels 74, 76.

The inner vessel 74 has the open space 22 projected from a substantially central part of an inner vessel body 78 having a horizontal cylindrical shape. The outer vessel 76 has an outer vessel open space 81 projected from a substantially central part of an outer vessel body 80. A top opening 24, which is in communication with the open space 22, is formed in the outer vessel open space 81. The top opening 24 is closed by the cap 56.

As shown in FIG. 11, a helmet-shaped concavity 82 which opens outward is formed horizontally in one side surface of the outer vessel body 80. The concavity 82 has a helmet-shape and a size which can accommodate the head of a person to be measured. An inner vessel concavity 84 is formed in the inner vessel body 78 in agreement with the concavity 82. A sensor support 86 is provided inside the inner vessel concavity 84. As shown in FIG. 11, the sensor support 86 is formed in the form of a dome of about a 30 cm diameter which covers the inner vessel concavity 84. In the sensor support 86 there are formed a plurality of holes 28 in the entire surface thereof. On the substantially central part of the surface of the sensor support 86 there is provided a male clamp 88 which is similar to the male clamp 30 of the magnetomeasuring apparatus 10. The male clamp 88 includes a long handle 90 which reaches the substantial center of an interior of the inner vessel 74. A sensor 92, which detects an environmental magnetic field, is mounted on a forward end of the handle 90. One set or a plurality of sets of the sensors 92 may be mounted thereon. A female clamp 94, which is similar to the female clamp 34 of the magnetomeasuring apparatus 10, is provided on the inner vessel concavity 84.

Magnetic field sensors 40, comprising SQUIDs, are disposed in the respective holes of the sensor support 86. Each of the magnetic field sensors 40 has a rod shape and is inserted in each of the holes to be secured to the sensor support 86.

The respective magnetic field sensors 40 are wired to the cord output 50 through measuring cords 42, a cord connector 42, a wire connector 46 and a wiring cords 48.

At first, liquid helium 52 is reserved in the inner vessel body 78 up to an 80%-level so that the magnetic field sensors 40 are immersed. The liquid helium 52 is a coolant for the magnetic field sensors 40. A liquid level of the liquid helium 52 in the inner vessel body 78 is detected by a level sensor 54 disposed inside the inner vessel body 78.

The measuring cords 42 are formed of copper wires, and have good heat conduction which makes a temperature of the inner vessel body 78 uniform. As a result, even when a liquid level of the liquid helium is lowered, and the magnetic field sensors 40 are exposed to gas phase helium, temperature increase can be suppressed, and the magnetic field detection is not affected.

Most of the constituent members of the cryostat 72 are formed of non-magnetic and non-conducting material, such as fiber reinforced resins, etc. so that they do not interfere with the detection of magnetic fields.

The mounting of the magnetic field sensors 40 on the sensor support 86 is carried out, when the magnetomeasuring apparatus 70 is assembled at the start, and when defective ones of the magnetic field sensors 40 are replaced by new ones for maintenance.

In order to mount the magnetic field sensors 40 on the sensor support 86 having a larger diameter than an inner diameter than the open space 22 of the inner vessel 14, as in the above-described magnetomeasuring apparatus 10, an operator puts a hand into the inner vessel 14 through the open space 22 when the sensor support 86 is pulled up to the lower end of the open space 22.

In the present embodiment, the method for mounting the magnetic field sensors 40 on the sensor support 86 and assembling the magnetomeasuring apparatus 70 is substantially the same as that for assembling the magnetomeasuring apparatus according to the first embodiment, but is different from the first embodiment in the method for removing the sensor support 86 from the inner vessel concavity 84.

In removing the sensor support 86, a hand is put into the inner vessel 74 through the open space 22 to pull the male clamp 88 and disengage the male clamp 88 from the female clamp 94. The sensor support 86, removed from the inner vessel concavity 84, is rested on rod support (not shown) through a lift rod or lift strings (not shown).

Thus, without taking the sensor support 86 out of the inner vessel 74, the magnetic field sensors 40 are mounted on the sensor support 86 to assemble the magnetomeasuring apparatus 70.

Similarly without taking the sensor support 86 out of the inner vessel 74, the magnetic field sensors 40 mounted on the sensor support 86 are replaced during maintenance.

Figure 12:
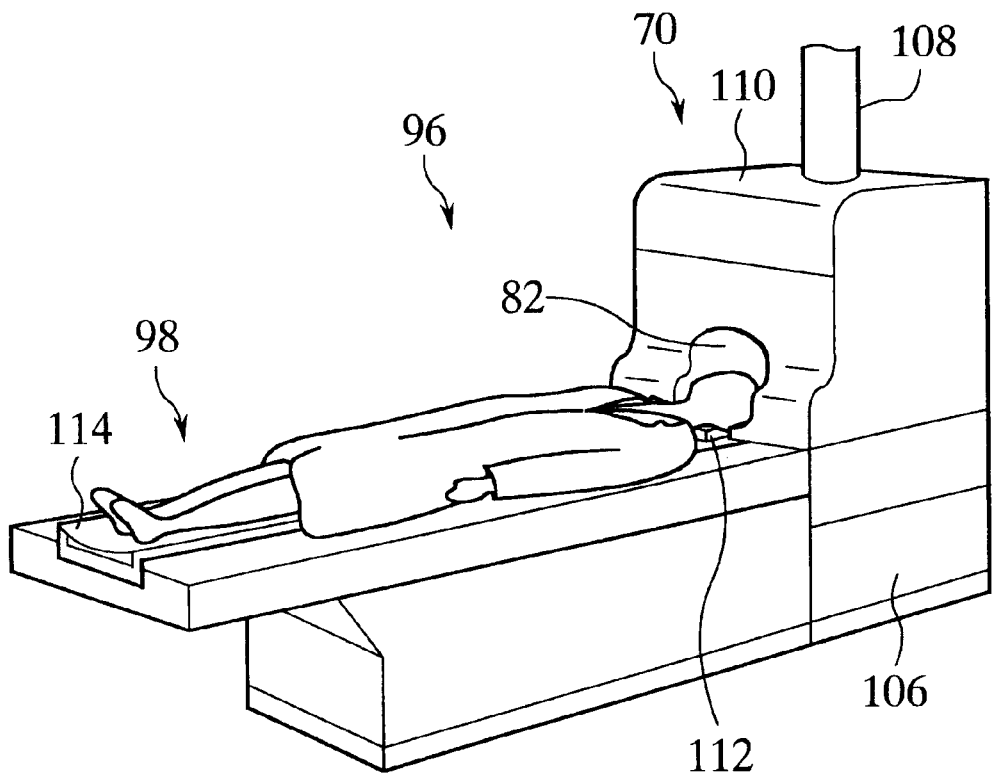
FIG. 12 is a perspective view of diagnostic apparatus using the magnetomeasuring apparatus according to the second embodiment of the present invention.
Figure 13:
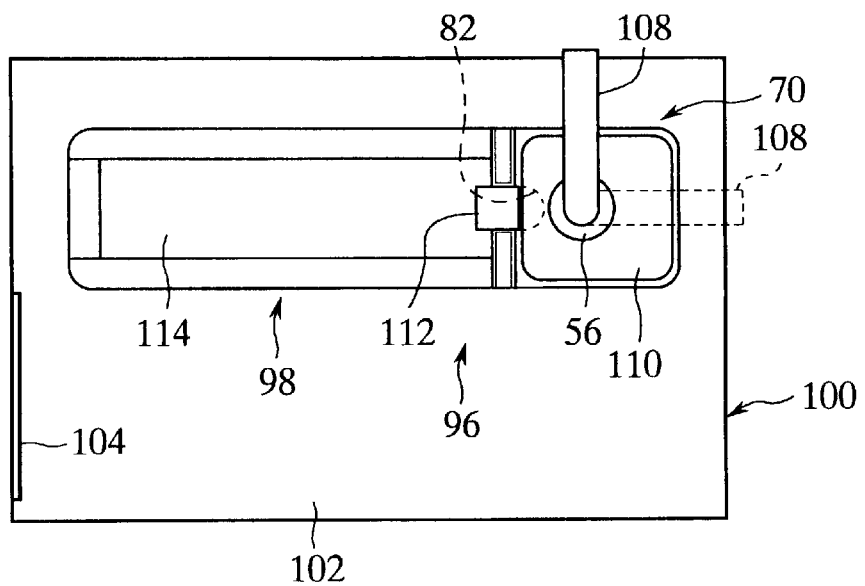
FIG. 13 is a plan view of the diagnostic apparatus using the magnetomeasuring apparatus according to the second embodiment of the present invention.
Figure 14:
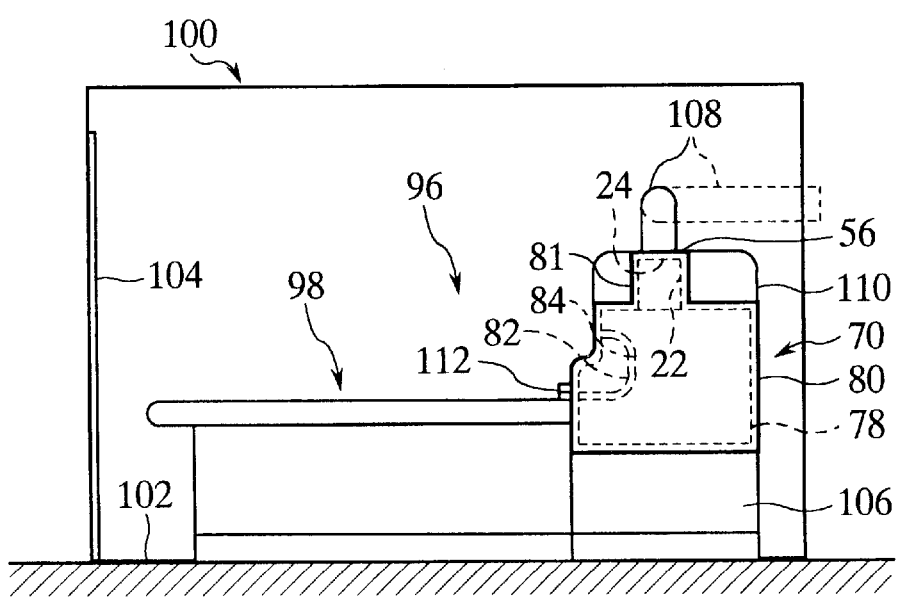
FIG. 14 is a front view of the diagnostic apparatus using the magnetomeasuring apparatus according to the second embodiment of the present invention.
Figure 15:
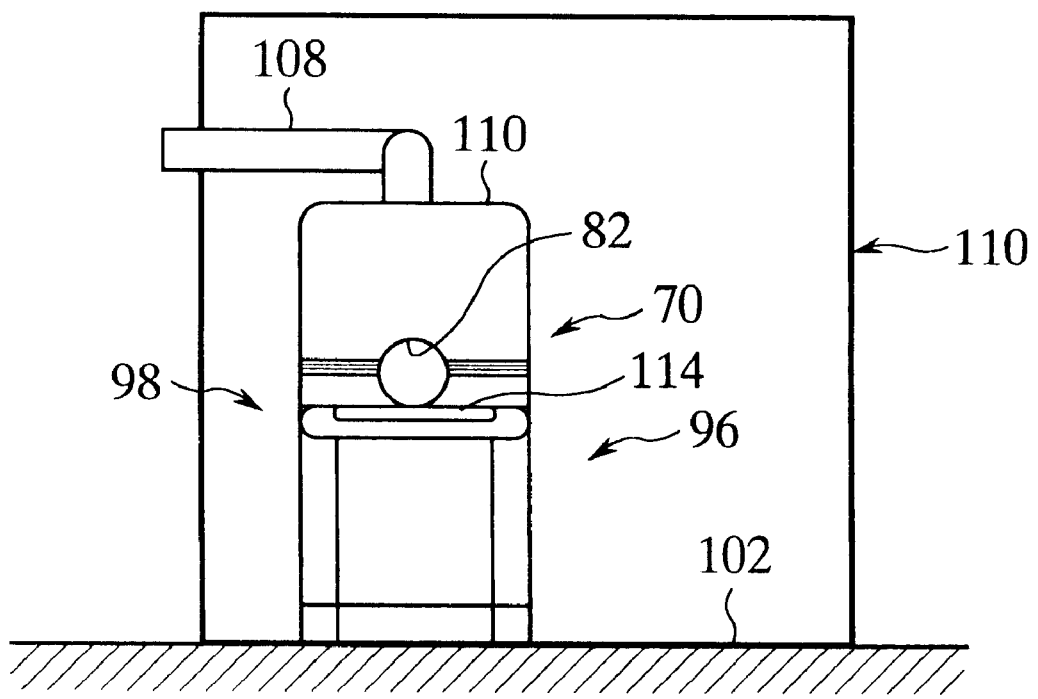
FIG. 15 is a side view of the diagnostic apparatus using the magnetomeasuring apparatus according to the second embodiment of the present invention.
Figure 16:
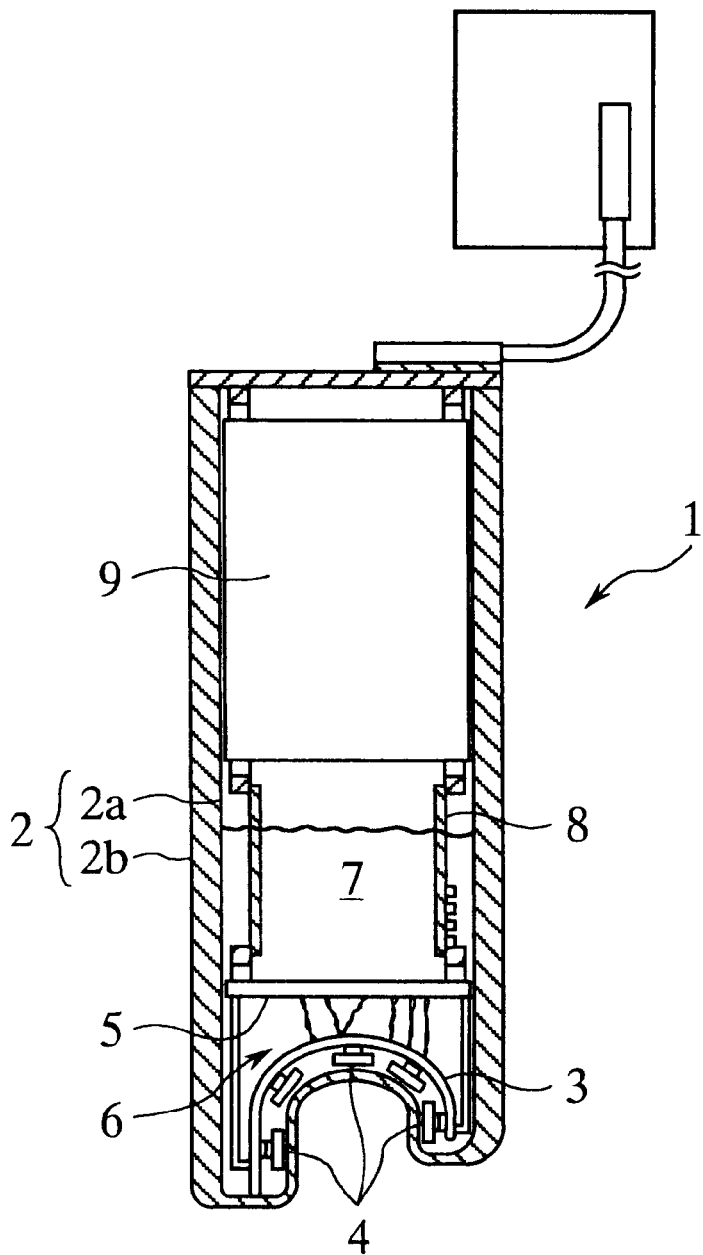
FIG. 16 is a sectional view of a conventional magnetomeasuring apparatus.

An example of a diagnostic apparatus using the magnetomeasuring apparatus according to the present embodiment is explained with reference to FIGS. 12 to 15. FIG. 12 is a perspective view of the diagnostic apparatus, FIG. 13 is a plan view of the diagnostic apparatus, FIG. 14 is a front view of the diagnostic apparatus, and FIG. 15 is a side view of the diagnostic apparatus.

As shown in FIG. 12, the diagnostic apparatus 96 comprises the magnetomeasuring apparatus 70 disposed on one end of a bed for a patient to lie on. As shown in FIGS. 13 to 15, the diagnostic apparatus 96 is placed on a floor 102 in a magnetically shielded room 100.

The magnetically shielded room 100 has an entrance/exit door 104. The cryostat 72 of the magnetomeasuring apparatus 70 is mounted on a table 106. A duct 108 is provided in the top side of the cryostat 72 opposed to the bed and upwardly extended outside. The duct 108 accommodates a charge/discharge pipe 60 provided in the cap 56, and the wiring (not shown) from the cord output 50. The duct 108 may be disposed in another side and extended outside the magnetically shielded room 100 as indicated by the dotted line. The top side of the cryostat 72, except the duct 108, is covered with a cover 110.

The bed 98 is positioned with a height adjusted so that the head of a patient lying on the bed 98 can be inserted in the concavity 82 of the cryostat 72. The bed 98 includes a movable table 114 with a pillow 12 at the side of the concavity 82. The movable table 114 is moved to and from the concavity 82 with a patient lying on with the head placed on the pillow 112.

Thus, the patient can have magnetic field distributions occurring in the head detected by the magnetic field sensors 40 while lying on the bed 98.

The magnetomeasuring apparatus 70 includes the magnetic field sensors 40 arranged so as to cover the head of the lying patient, thus the cryostat 72 is lowered in height and the magnetomeasuring apparatus 70 is also lowered in height.

Accordingly, a ceiling of the magnetically shielded room 100 for the magnetomeasuring apparatus 70 can be lowered. As a result, the magnetically shielded room 100 including the diagnostic apparatus can be placed in ordinary room having low ceilings.

The present invention is not limited to the above-described embodiments and covers other various modifications.

For example, the measuring surface of the sensor support 26, 86 is not essentially disk shaped and helmet-shaped. The cryostat 12, 27, including the inner vessel 14, 4 and the outer vessel 16, 76, is not essentially cylindrical. The open space 22 of the inner vessel 14, 74 is not essentially cylindrical.

The magnetic field sensors 40 are mounted by putting a hand into the open space 22, but may be mounted by the use of mounting means which can be operated by remote control.

In engaging and disengaging the sensor support 26, 86 with and from the inner vessel 14, 74, without using the lift rod 66, a hand is put into the inner vessel 14, 74 through the open space 22 to directly hold the handle 31, 90 by the hand so as to engage and disengage the sensor support 26, 86.

What is claimed is:

1. A magnetomeasuring apparatus comprising:
   magnetic field sensors;
   a sensor support for disengageably supporting said magnetic field sensors;
   a coolant vessel having an interior with a measuring surface and said sensor support disposed in said interior at said measuring surface;
   fixing means for disengageably fixing said sensor support, with said magnetic field sensors mounted thereon, to said measuring surface of the cooling vessel, thereby permitting removal of said sensor support from said measuring surface; and said cooling vessel having an opening, disposed for accessing said magnetic field sensors, which has a smaller size than the measuring surface and a greater size than ones of said magnetic field sensors to permit installation of said magnetic field sensors on said support surface via said opening.

2. The magnetomeasuring apparatus according to claim 1, wherein:

said measuring surface of said cooling vessel is formed in a side of said coolant vessel and defines a concavity, in an outside surface of said coolant vessel, adapted to cover at least a part of a head of a human; and said sensor support has a configuration which permits said magnetic field sensors to be disposed in conformance with a contour of the measuring surface.

3. A magnetomeasuring apparatus comprising:

magnetic field sensors;

a sensor support for disengageably supporting said magnetic field sensors;

a coolant vessel having an interior with a measuring surface and said sensor support disposed in said interior at said measuring surface;

fixing means for disengageably fixing said sensor support, with said magnetic field sensors mounted thereon, to said measuring surface of the cooling vessel, thereby permitting removal of said sensor support from said measuring surface; and said cooling vessel having an opening, disposed for accessing said magnetic field sensors, which has a smaller size than said support surface and a greater size than ones of said magnetic field sensors to permit installation of said magnetic field sensors on said support surface via said opening.

4. The magnetomeasuring apparatus according to claim 3, wherein:

said measuring surface of said cooling vessel is formed in a side of said coolant vessel and defines a concavity, in an outside surface of said coolant vessel, adapted to cover at least a part of a head of a human; and said sensor support has a configuration disposing said magnetic field sensors in conformance with a contour of the measuring surface.

* * * * *